(12) United States Patent
Ikehashi (10) Patent No.: US 9,493,339 B2
(45) Date of Patent: Nov. 15, 2016

(54) MICRO ELECTRO MECHANICAL SYSTEM (71) Applicant: KABUSHIKI KAISHA TOSHIBA, Minato-ku, Tokyo (JP)

(72) Inventor: Tamio Ikehashi, Yokohama Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/644,184

(22) Filed: Mar. 10, 2015

(65) Prior Publication Data

US 2016/0060098 A1 Mar. 3, 2016

Related U.S. Application Data

(60) Provisional application No. 62/044,717, filed on Sep. 2, 2014.

(51) Int. Cl.
*H01L 29/84* (2006.01)
*B81B 3/00* (2006.01)

(52) U.S. Cl.
CPC ...... *B81B 3/0021* (2013.01); *B81B 2201/0235* (2013.01); *B81B 2201/0242* (2013.01); *B81B 2201/0264* (2013.01); *B81B 2203/0127* (2013.01)

(58) Field of Classification Search
CPC .............. B81B 2201/0235; B81B 2201/0242; B81B 2201/0264; B81B 2203/0127
See application file for complete search history.

(56) References Cited

U.S. PATENT DOCUMENTS

| 2007/0214891 | A1* | 9/2007 | Robert | B81B 3/0062 73/514.32 |
| 2008/0229847 | A1* | 9/2008 | Harish | G01G 7/06 73/862.625 |
| 2009/0160462 | A1* | 6/2009 | Harish | B60C 23/0408 324/686 |
| 2010/0038753 | A1 | 2/2010 | Ni | |
| 2013/0234263 | A1 | 9/2013 | Ikehashi | |
| 2014/0133685 | A1* | 5/2014 | Liu | H04R 7/20 381/355 |
| 2015/0068314 | A1* | 3/2015 | Nakamura | G01L 9/0072 73/724 |

FOREIGN PATENT DOCUMENTS

JP 2014041236 A 3/2014

* cited by examiner

*Primary Examiner* — Shaun Campbell
(74) *Attorney, Agent, or Firm* — Holtz, Holtz & Volek PC (57) ABSTRACT

According to an embodiment, a MEMS includes a substrate; a substrate; a membrane arranged above the substrate; a first conductor with a first plane, the first conductor being connected to the membrane; and a second conductor with a second plane facing the first plane, the second conductor being arranged with a gap between the first conductor and the second conductor, wherein relative positions of the first conductor and the second conductor change in a direction in which an area of the first plane facing the second plane changes.

16 Claims, 10 Drawing Sheets

MICRO ELECTRO MECHANICAL SYSTEM

CROSS REFERENCE TO RELATED APPLICATIONS

This application claims the benefit of U.S. Provisional Application No. 62/044,717, filed Sep. 2, 2014, the entire contents of which are incorporated herein by reference.

FIELD

This embodiment relates to a micro electro mechanical system.

BACKGROUND

A micro electro mechanical system using a membrane or the like is known.

DETAILED DESCRIPTION

A pressure sensor or the like using a membrane is known as a micro electro mechanical system (MEMS). The membrane is arranged parallel to, for example, a substrate. For example, the membrane is provided with a movable electrode section, and the substrate is provided with a fixed electrode section. Upon receipt of a pressure, the membrane is bent toward the substrate side, and the parallel-plate capacitance configured of the movable electrode section and the fixed electrode section changes. Thereby, the pressure is detected.

However, in the pressure sensor described above, the parallel-plate capacitance changes nonlinearly with respect to pressure. For this reason, the sensitivity of the pressure sensor is poor, and it is difficult to detect the pressure in a wide range in some cases.

According to the embodiments to be described hereinafter, it is possible to improve the detection sensitivity of a physical quantity such as a pressure or the like in a wide range. That is, the MEMS of an embodiment is provided with a substrate, a substrate; a membrane arranged above the substrate; a first conductor with a first plane, the first conductor being connected to the membrane; and a second conductor with a second plane facing the first plane, the second conductor being arranged with a gap between the first conductor and the second conductor, wherein relative positions of the first conductor and the second conductor change in a direction in which an area of the first plane facing the second plane changes.

The MEMS of another embodiment is provided with a substrate; a membrane with a flexibility arranged above the substrate, the membrane extending in a first direction; a first conductor with a first plane extending in a second direction, the first conductor being connected to the membrane, the second direction crossing the first direction; and a second conductor with a second plane facing the first plane, the second conductor being arranged with a gap between the first conductor and the second conductor.

The above-mentioned embodiments will be described below with reference to the drawings. In the drawings, identical parts are denoted by identical reference symbols. Further, duplicate descriptions will be given as the need arises.

<First Embodiment>

Hereinafter, a MEMS according to this embodiment will be described. The MEMS according to this embodiment is, for example, a pressure sensor using a membrane.

(1) Configuration Example of MEMS

Figure 1:
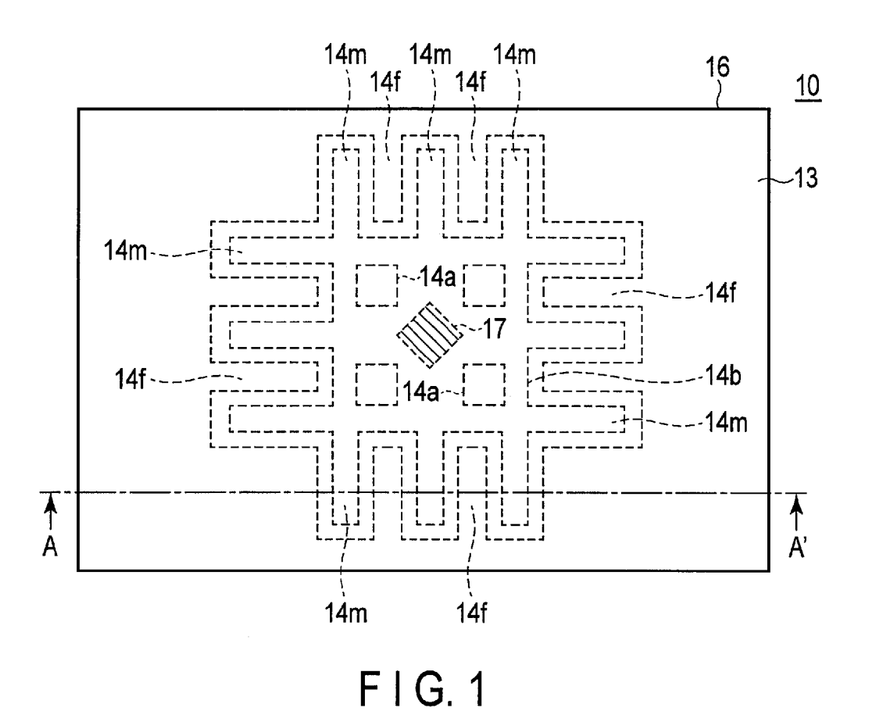
FIG. 1 shows a configuration example of a MEMS according to a first embodiment from the top surface side.
Figure 2:
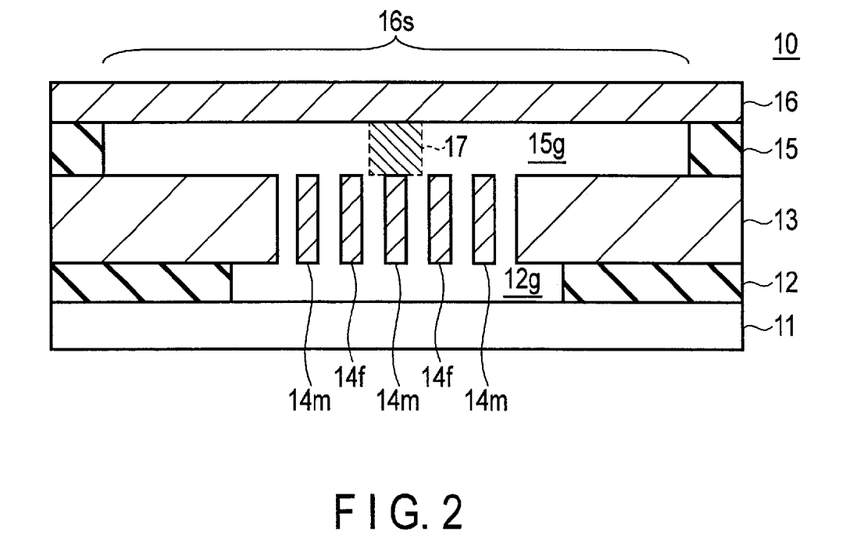
FIG. 2 shows the configuration example of the MEMS according to the first embodiment in a cross section thereof along line A-A' of FIG. 1.

A configuration example of a pressure sensor 10 as the MEMS according to this embodiment will be described below by using FIG. 1, and FIG. 2. FIG. 1 shows a configuration example of the MEMS according to this embodiment from the top surface side. FIG. 1 is a top perspective view showing a membrane 16 and structure below the membrane 16. FIG. 2 shows the configuration example of the MEMS according to this embodiment in a cross section along line A-A' of FIG. 1.

As shown in FIG. 1, and FIG. 2, the pressure sensor 10 is provided with a laminated structure in which a first film 12, a second film 13, a third film 15, and a membrane 16 are arranged on a substrate 11 in the order mentioned.

The substrate 11 is formed into a shape of a flat plate including a first principal plane and second principal plane. The substrate 11 contains, for example, silicon (Si), silicon-germanium (SiGe) or the like as the principal component.

In the following description, of the two principal planes of the substrate 11, the plane on which the various constituent elements 12 to 16 described above are formed is referred to as the top surface. In each of the various constituent elements 12 to 16 too, the plane on the side identical to the top surface of the substrate 11 is regarded as the top surface. Further, a direction parallel to the top surface of the substrate 11 is a direction along the top surface of the substrate 11, is a direction parallel to or approximately parallel to, for example, the top surface of the substrate 11, and is a direction in which the various constituent elements 12 to 16 extend in a film-like form. A direction perpendicular to the top surface of the substrate 11 is a direction intersecting the top surface of the substrate 11, is a direction perpendicular to or approximately perpendicular to, for example, the top surface of the substrate 11, and is a direction in which, for example, the various constituent elements 12 to 16 are laminated.

The first film 12 is provided on the top surface of the substrate 11, and includes an opening in the plane thereof. A gap 12g is formed between the substrate 11, and second film 13 by such an opening. The first film 12 has silicon oxide (SiO), silicon nitride (SiN) or the like as the principal component.

The second film 13 is provided on the top surface of the first film 12. The second film 13 has a thickness of, for example, greater than or equal to 5 µm, and less than or equal to 30 µm, and has a thickness of, for example, about 10 µm. The second film 13 also has an opening in the plane thereof. Such an opening is formed, for example, in the shape of a cross when viewed from the top surface side. A plurality of fixed electrode sections 14f protrude from four sides corresponding to the top parts of the cross shape of the opening of the second film 13 toward the inside of the opening. The plurality of fixed electrode sections 14f are fixed at positions above the substrate 11 through the second film 13 and first film 12, and are arranged in a direction parallel to the top surface of the substrate 11 at certain intervals.

A movable body 14b is arranged in the opening of the second film 13. The movable body 14b is provided with a plurality of openings 14a. The plurality of openings 14a are arranged in such a manner that the openings 14a have symmetry in the surface of the movable body 14b. That is, the movable body 14b is formed into, for example, a rectangle when viewed from the top surface side, and the openings 14a are arranged at, for example, the four corners of the movable body 14b. A plurality of movable electrode sections 14m protrude from the four sides on the outer edge of the movable body 14b toward the second film 13. The plurality of movable electrode sections 14m are arranged above the substrate 11 parallel to the substrate 11 in a state where the movable electrode sections 14m are not fixed to the substrate 11. Each of the movable electrode sections 14m is kept in a state where it is inserted in a gap between the fixed electrode sections 14f.

In this way, the fixed electrode sections 14f and the movable electrode sections 14m are alternately arranged with certain gaps held between them in such a manner that they do not overlap each other. Each of the fixed electrode sections 14f and each of the movable electrode sections 14m configure a parallel-plate electrode structure extending in a direction perpendicular to the top surface of the substrate 11. That is, the fixed electrode sections 14f and the movable electrode sections 14m configure a comb-shaped electrode structure provided with a plurality of comb-like protrusions. Each comb-like protrusion of the comb-shaped electrode structure corresponds to the fixed electrode section 14f or the movable electrode section 14m. The plurality of comb-like protrusions extend in four directions, whereby these comb-like protrusions are arranged in such a manner that the comb-like protrusions have symmetry in, for example, the plane of the membrane 16. In this description, "electrode" implies an electrically conductive part provided at a circuit end.

The second film 13, the fixed electrode sections 14f, the movable electrode sections 14m, and the movable body 14b each have an identical substance as the principal component. Such a substance is, for example, a silicon series material, metallic material or the like. The silicon series material includes, for example, Si, SiGe, and the like. The metallic material includes, for example, aluminum (Al), gold (Au), copper (Cu), and the like. A composite material formed by combining SiO, SiN or the like as a silicon series material, and Al, Au, Cu or the like as a metallic material with each other may also be used. When the principal component of the fixed electrode sections 14f, movable electrode sections 14m, and movable body 14b is Si, SiGe or the like, the material may be doped with impurities, and may have electrical conductivity.

The third film 15 is provided on the top surface of the second film 13, and includes an opening in the plane thereof. A gap 15g is formed between the second film 13 and membrane 16 by such an opening. The third film 15 has, for example, SiO, SiN or the like as the principal component.

The membrane 16 is provided on the top surface of the third film 15. In this manner, the membrane 16 is arranged above the substrate 11, i.e., the membrane 16 is arranged above the top surface of the substrate 11 parallel to the top surface of the substrate 11. The membrane 16 is supported by the third film 15 at an outer edge thereof. A part of the membrane 16 not supported by the third film 15, i.e., the part of the membrane 16 hung over the gap 15g corresponds to a movable plane 16s of the membrane 16. A distance from one end of the outer edge of such a movable plane 16s to the other end of the outer edge via the center of the movable plane 16s is, for example, greater than or equal to 50 µm, and less than or equal to 300 µm. It is desirable that such a distance be selected according to the pressure range in which the pressure sensor 10 is used. In a pressure sensor 10 to be used under atmospheric pressure, such a distance may be, for example, 300 µm. In a pressure sensor 10 to be used under higher pressure, such a distance may be, for example, 100 µm or furthermore, may be 50 µm.

An anchor 17 is arranged under the membrane 16. The anchor 17 protrudes toward the inside of the gap 15g to thereby connect the membrane 16 and movable body 14b to each other. The anchor 17 is arranged at, for example, the center of the plane of the membrane 16. More desirably, the anchor 17 is arranged at the center of the movable plane 16s.

The center of the plane of the membrane 16 or the movable plane 16s includes the central point and its vicinity of the membrane 16 or the movable plane 16s. The anchor 17 is arranged at the central point or in the vicinity of the central point of the plane of the membrane 16 or the movable plane 16s. The anchor 17 has a shape with rotational symmetry such as a regular polygonal column including, for example, a quadrangular prism or a circular cylinder. It is desirable that a central point of such an anchor 17 be coincident with the central point of the plane of the membrane 16 or the movable plane 16s. Further, it is desirable, in the pressure sensor 10, that the central point of the plane of the membrane 16 and the central point of the movable plane 16s be coincident with each other.

The membrane 16 and the anchor 17 have, for example, a silicon series material as their principal components. The silicon series material includes, for example, amorphous silicon (a-Si), Si, SiGe, and the like. When the principal component of each of the membrane 16 and anchor 17 is Si, SiGe or the like, the material may be doped with impurities, and may have electrical conductivity. The membrane 16 may include a structure in which a plurality of a-Si layers are laminated or a structure in which a plurality of layers including a-Si and SiO or a-Si and SiN are laminated.

The inside of the laminated structure configured as described above, and including the gaps 12g and 15g is sealed up, for example, from outside, and maintains a constant pressure.

(2) Operation Example of MEMS

Figure 3:
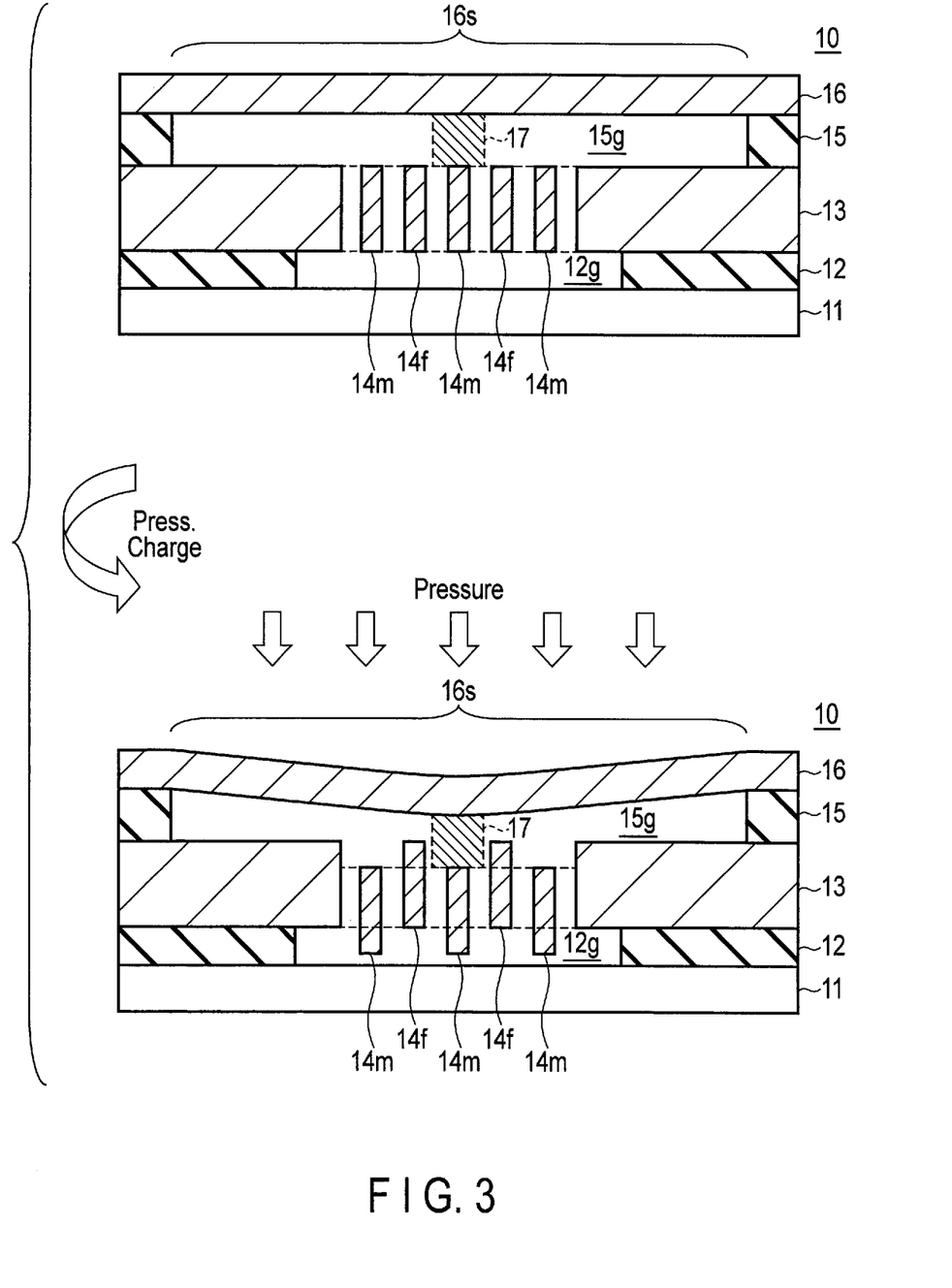
FIG. 3 shows an example of an operation of the MEMS according to the first embodiment.

An operation example of the pressure sensor 10 will be described below by using FIG. 3. FIG. 3 shows an example of an operation of the MEMS according to this embodiment.

As shown in FIG. 3, when no pressure is applied to the pressure sensor 10 from outside the pressure sensor 10, the positions of the fixed electrode sections 14f and movable electrode sections 14m in the vertical direction, i.e., the distances (heights) from the substrate 11 to the fixed electrode sections 14f and movable electrode sections 14m are approximately equal to each other. Accordingly, the surface of each of the movable electrode sections 14m opposed to the surface of each of the fixed electrode sections 14f is approximately equal to the maximum value in the configuration of the pressure sensor 10. Thus, the parallel-plate capacitance (electrostatic capacitance) between the fixed electrode sections 14f, and movable electrode sections 14m is also approximately equal to the maximum value.

When pressure is applied to the pressure sensor 10 from outside the pressure sensor 10, the membrane 16 is bent downwardly, i.e., toward the substrate 11 side. More specifically, the pressure inside the pressure sensor 10 is kept constant and, when the pressure outside the pressure sensor 10 becomes higher than the pressure inside, the membrane 16 is bent toward the substrate 11 side. Thereby, the anchor 17 is also pushed down toward the substrate 11 side, and such an operation is transmitted to the movable body 14b. That is, the movable body 14b and the movable electrode sections 14m are also pushed down toward the substrate 11 side. Conversely, the fixed electrode sections 14f are fixed to the substrate 11, and the distance between each of the fixed electrode sections 14f and substrate 11 is not changed. Accordingly, the surface of each of the movable electrode sections 14m opposed to the surface of each of the fixed electrode sections 14f is changed from that in the case where no pressure is applied to the pressure sensor 10. Thus, the parallel-plate capacitance between the fixed electrode sections 14f and movable electrode sections 14m is also changed. More specifically, when pressure is applied to the pressure sensor 10, for example, the area of the surface of each of the movable electrode sections 14m opposed to each of the fixed electrode sections 14f is reduced, and the parallel-plate capacitance between the fixed electrode sections 14f and movable electrode sections 14m is also reduced.

A pressure value is calculated from the parallel-plate capacitance between the fixed electrode sections 14f and movable electrode sections 14m. The less the parallel-plate capacitance detected by the pressure sensor 10, the greater the bending of the membrane 16 is, and it is indicated that the movable electrode sections 14m are largely depressed downwardly. That is, a higher pressure value is detected as the pressure outside the pressure sensor 10. The greater the parallel-plate capacitance detected by the pressure sensor 10, the less the bending of the membrane 16 is, and it is indicated that the displacement of the movable electrode sections 14m in the downward direction is also small. That is, a lower pressure value is detected as the pressure outside the pressure sensor 10.

In view of the operation of the pressure sensor 10 described above, in the pressure sensor 10, the sensitivity of the pressure sensor 10 is improved by at least one of the following methods. That is, reducing the distance between the fixed electrode sections 14f and movable electrode sections 14m, increasing the number of the fixed electrode sections 14f and movable electrode sections 14m, and increasing the area of each of the fixed electrode sections 14f and area of each of the movable electrode sections 14m opposed to each other. In order to increase such areas, it is sufficient if one or both of a length in the direction parallel to the top surface of the substrate 11 and length in the direction perpendicular to the top surface of the substrate 11 of each of the fixed electrode sections 14f and movable electrode sections 14m is or are increased.

(3) Manufacturing Method of MEMS

An example of a manufacturing method of the pressure sensor 10 will be described below by using FIGS. 4 to 12. FIGS. 4 to 12 each show an example of a manufacturing process of the MEMS according to this embodiment in order.

Figure 4:
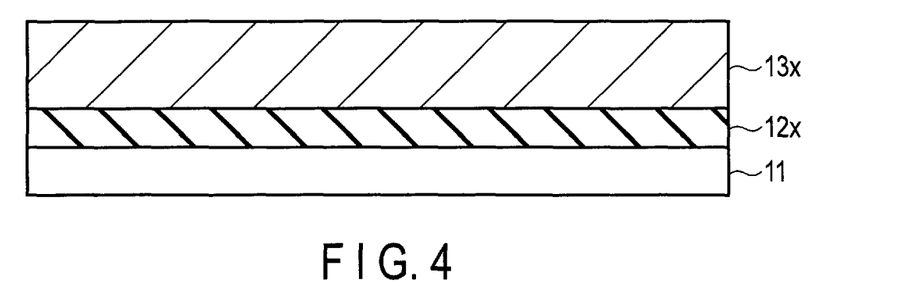
FIG. 4, FIG. 5, FIG. 6, FIG. 7, FIG. 8, FIG. 9, FIG. 10, FIG. 11, and FIG. 12 each show an example of a manufacturing process of the MEMS according to the first embodiment.

First, a substrate 11 having Si, SiGe or the like as the principal component is prepared.

As shown in FIG. 4, a sacrificial film 12x is formed on the top surface of the substrate 11. The sacrificial film 12x has, for example, SiO or the like as the principal component. On the top surface of the sacrificial film 12x, for example, a silicon film 13x which will later become a second film 13, the fixed electrode sections 14f, movable electrode sections 14m, and movable body 14b is formed. A part of the area of the silicon film 13x which will become the fixed electrode sections 14f, movable electrode sections 14m, and movable body 14b may be doped with impurities.

Figure 5:
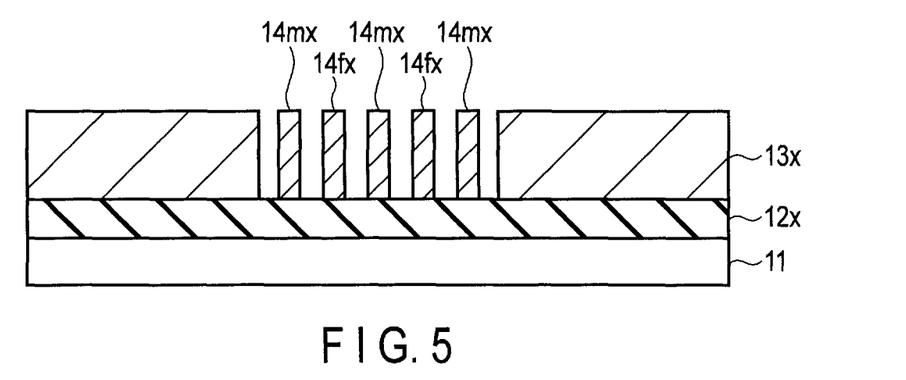

As shown in FIG. 5, the silicon film 13x is processed, and a plurality of silicon pieces 14fx, 14mx are formed. More specifically, a resist pattern (not shown) is formed on the top surface of the silicon film 13x. The silicon film 13x is etched by using such a resist pattern as a mask, whereby the silicon pieces 14fx, and 14mx are formed. In the etching of the silicon film 13x, a gas, a chemical solution or the like of the halogen series such as hydrogen fluoride (HF) or the like is used.

Further, at this time, a silicon piece which will later become the movable body 14b is also formed. Such a silicon piece is formed in such a manner that the silicon piece has a plurality of openings. Such openings correspond to the openings 14a of FIG. 1.

Figure 6:
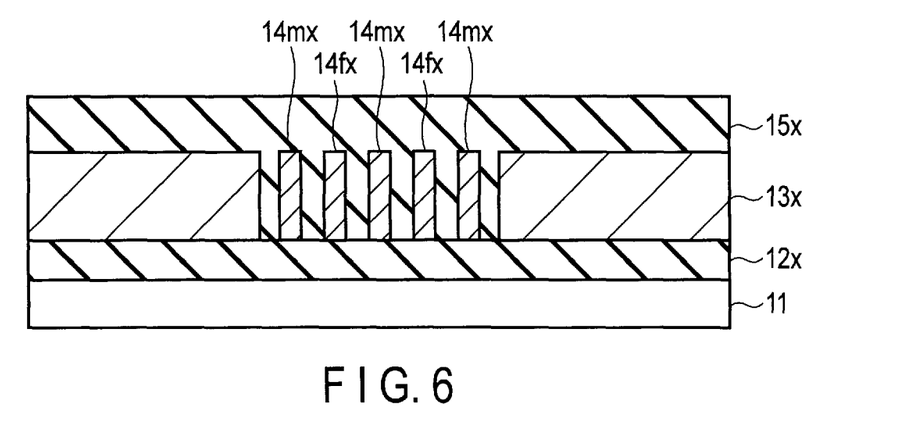

As shown in FIG. 6, a sacrificial film 15x is formed on the top surfaces of the silicon film 13x, and silicon pieces 14fx, and 14mx. The sacrificial film 15x is also embedded in gaps between the silicon pieces 14fx, and 14mx. The sacrificial film 15x has, for example, SiO or the like as the principal component.

Figure 7:
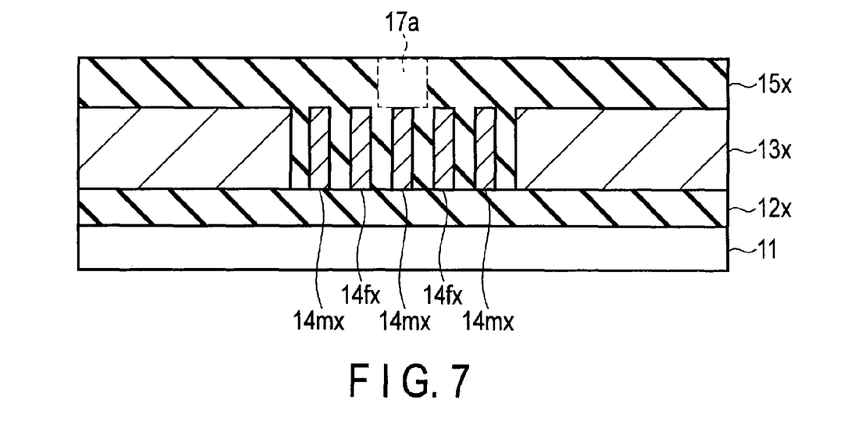

As shown in FIG. 7, the sacrificial film 15x is processed, and an opening 17a is formed. More specifically, a resist pattern (not shown) is formed on the top surface of the sacrificial film 15x. The sacrificial film 15x is etched by using such a resist pattern as a mask, whereby the opening 17a is formed. In the etching of the sacrificial film 15x, for example, a gas, a chemical solution or the like of the halogen series is used.

Figure 8:
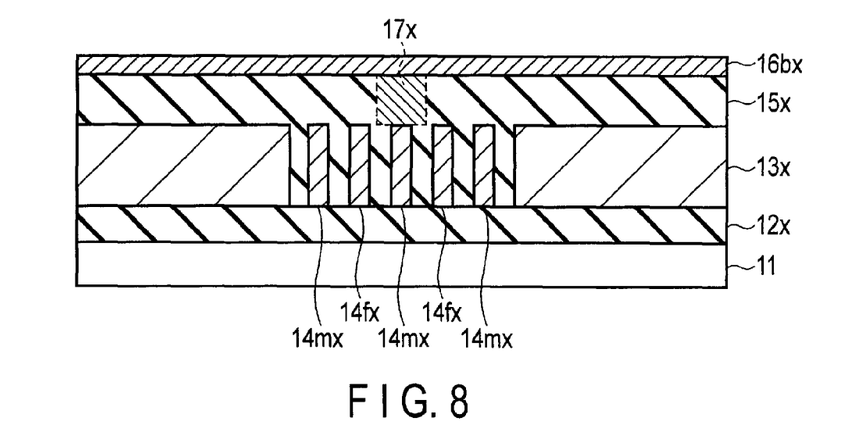

As shown in FIG. 8, for example, a-Si or the like is embedded in the opening 17a of the sacrificial film 15x, and a block 17x which will later become the anchor 17 is formed. On the top surface of the sacrificial film 15x, a thin layer 16bx which will later become part of the membrane 16 is formed. The thin layer 16bx can have a substance identical to the block 17x, for example, a-Si or the like as the principal component. In this case, the block 17x, and the thin layer 16bx may be collectively formed. The block 17x and the thin layer 16bx may consecutively or collectively be doped with impurities.

Figure 9:
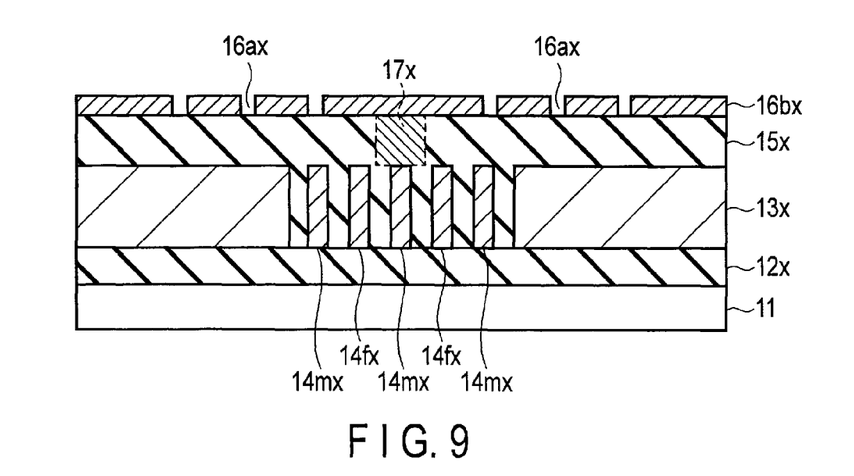

As shown in FIG. 9, the thin layer 16bx is processed, and a plurality of openings 16ax are formed. More specifically, a resist pattern (not shown) is formed on the top surface of the thin layer 16bx. The thin layer 16bx is etched by using such a resist pattern as a mask, whereby the openings 16ax are formed. In the etching of the thin layer 16bx, for example, a gas, a chemical solution or the like of the halogen series is used. It is desirable that the plurality of openings 16*ax* be arranged in such a manner that the openings 16*ax* have symmetry in the movable plane 16*s* of the membrane 16. At least part of the plurality of openings 16*ax* may be formed at positions overlapping the openings 14*a* of the movable body 14*b* when viewed from the top surface side.

Figure 10:
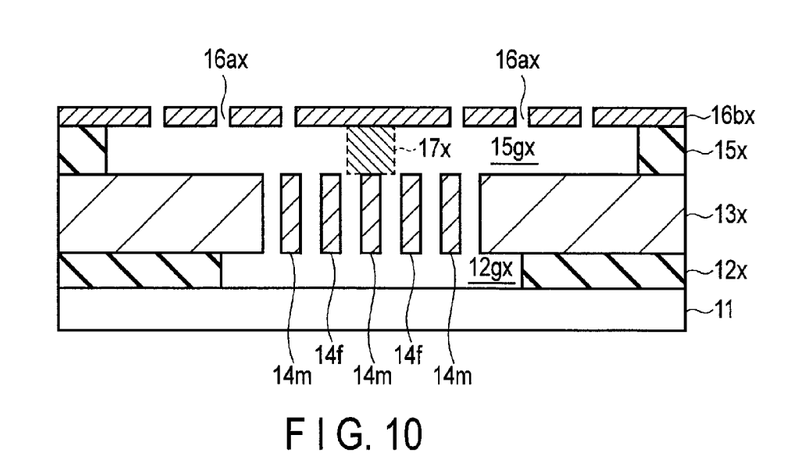

As shown in FIG. 10, the sacrificial films 15*x* and 12*x* are processed, and the gaps 15*gx* and 12*gx* are formed. More specifically, hydrofluoric acid is sprayed onto the top surface of the thin layer 16*bx*, and the sacrificial films 15*x* and 12*x* are etched in sequence through the openings 16*ax*. At this time, parts of the sacrificial films 15*x* and 12*x* separate from the openings 16*ax* and remain as the third and first films 15 and 12, and only the vicinities of the openings 16*ax* and parts around the openings 16*ax* are etched.

Figure 11:
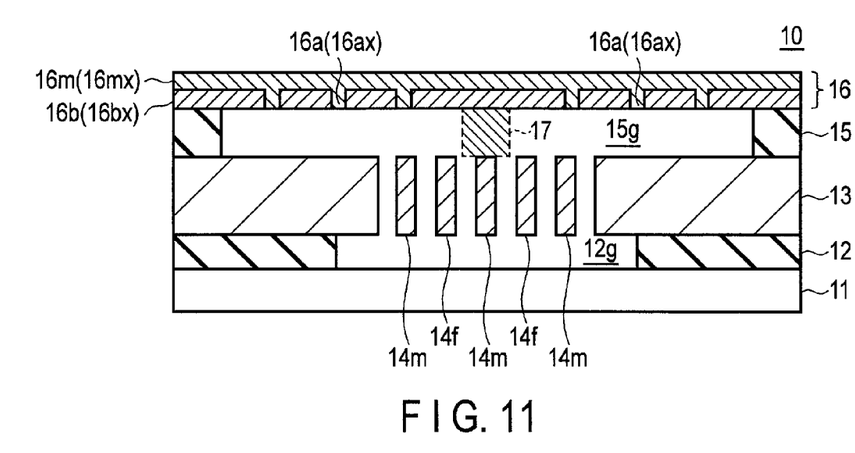

As shown in FIG. 11, a thin layer 16*mx* which will later become part of the membrane 16 is formed on the top surface of the thin layer 16*bx*. Thereby, the openings 16*ax* of the thin layer 16*bx* are closed, and the inside of the laminated structure is sealed. The thin layer 16*mx* can have, for example, a-Si or the like as the principal component. Thus, the pressure sensor 10 is manufactured.

The principal component of the thin layer 16*mx* may also be SiO, SiN or the like. In this case, the thin layer 16*mx* differs from the thin layer 16*bx* having, for example, a-Si or the like as the principal component in the material, and the thin layer 16*mx* and the thin layer 16*bx* are different from each other in thermal expansion coefficient, stress, and the like in some cases. There is the possibility of such a difference in thermal expansion coefficient causing a warp in the membrane 16, and lowering the accuracy of pressure detection.

Figure 12:
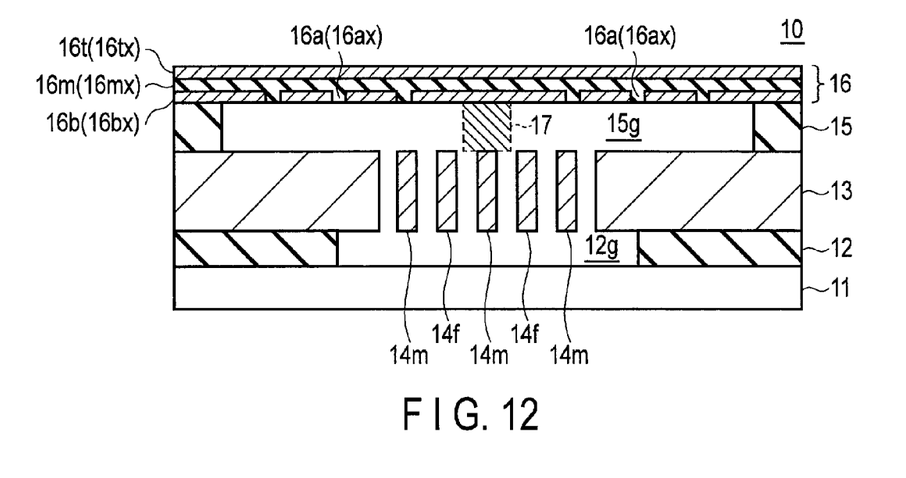

As shown in FIG. 12, when the thin layer 16*bx*, and the thin layer 16*mx* have substances different from each other as the principal components, a thin layer 16*tx* is further formed on, for example, the top surface of the thin layer 16*mx*. The thin layer 16*tx* can have a substance identical to the thin layer 16*bx*, for example, a-Si or the like as the principal component. Thereby, the thin layers 16*bx*, and 16*tx* each having the identical substance as the principal components are arranged above and below with the thin layer 16*mx* having a substance different from the thin layers 16*bx* and 16*tx* interposed between the thin layers 16*bx* and 16*tx*. Thus, the thermal expansion coefficient and the stress of the membrane 16 become symmetrical in the vertical direction, and a warp of the membrane 16 can be suppressed from occurring. Thus, the pressure sensor 10 is manufactured.

As described above, the membrane 16 of the pressure sensor 10 may include a plurality of, i.e., two or three thin layers 16*b*, 16*m*, and 16*t*.

It should be noted that in the pressure sensor 10, although the openings 16*a* of the thin layer 16*b* are closed by the thin layer 16*m*, vestiges of the openings 16*a* can be noticed in some cases. The thin layer 16*b* and the thin layer 16*m* are discontinuous layers, and the openings 16*a* can be recognized as the discontinuity between the thin layer 16*b* and thin layer 16*m* or as the interface between the thin layer 16*b* and thin layer 16*m* in some cases.

(4) Effects According to the Embodiment

According to this embodiment, the following one or the plurality of effects is or are produced.

(A) According to this embodiment, the movable electrode sections 14*m* connected to the membrane 16, and the fixed electrode sections 14*f* configure a parallel-plate electrode structure extending in a direction perpendicular to the top surface of the substrate 11.

In general, the parallel-plate capacitance, i.e., the electrostatic capacitance C between the fixed electrode sections and movable electrode sections is obtained from the following formula by the relative dielectric constant ∈, area S of the parallel-plate electrode, and distance d between the parallel-plate electrodes.

$$C = \epsilon \cdot (S/d)$$

As a comparative example of the pressure sensor, for example, a pressure sensor in which a membrane and a substrate opposed to each other are provided with movable electrode sections and fixed electrode sections, respectively, can be given. In such a pressure sensor, the membrane is bent toward the substrate side by the external pressure of the pressure sensor, and the distance d between the fixed electrode sections and movable electrode sections is changed. Thereby, the parallel-plate capacitance C between the fixed electrode sections and movable electrode sections is changed.

Figure 13:
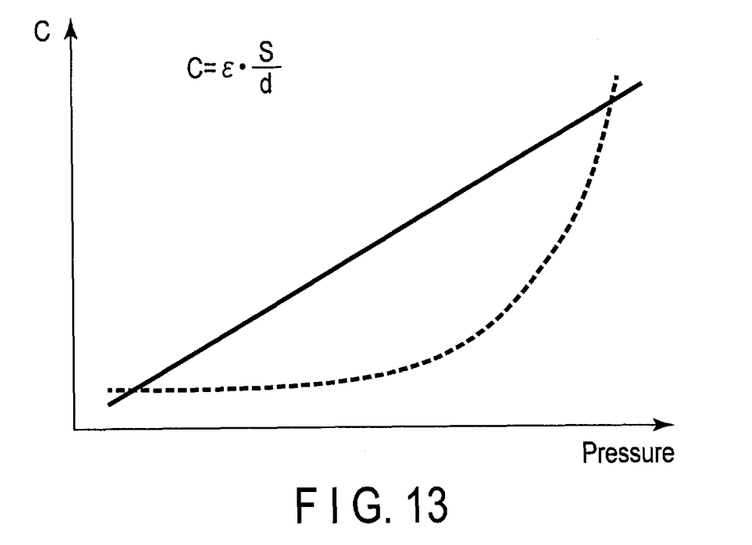
FIG. 13 shows a relationship between the electrostatic capacitance and pressure of each of the MEMS according to the first embodiment, and MEMS according a comparative example.

However, as indicated by the plot of a dotted line in FIG. 13, the parallel-plate capacitance C between the fixed electrode sections and movable electrode sections based on a change in the distance between the fixed electrode sections and movable electrode sections is changed nonlinearly by the external pressure of the pressure sensor. For this reason, it is difficult to obtain a pressure sensor of a high degree of sensitivity. When the distance between the fixed electrode sections and movable electrode sections is reduced, although the sensitivity of the pressure is somewhat improved, a defect of easily causing noise is brought about.

Conversely, in this embodiment, when the membrane 16 is bent by the external pressure, the movable electrode sections 14*m* are pushed down, and the area S of each of the surfaces of the fixed electrode section 14*f* and movable electrode section 14*m* opposed to each other is changed. Thereby, the parallel-plate capacitance C between the fixed electrode sections 14*f*, and movable electrode sections 14*m* is changed. As indicated by the plot of a solid line in FIG. 13, the parallel-plate capacitance C based on a change in such an area S is changed linearly by the external pressure of the pressure sensor 10.

As described above, in this embodiment, the parallel-plate capacitance between the fixed electrode sections 14*f*, and movable electrode sections 14*m* is linearly changed by the external pressure. Accordingly, it is possible to improve the sensitivity of the pressure sensor 10 over a wide pressure range. That is, it is possible to expand the dynamic range of the pressure sensor 10.

(B) According to this embodiment, the pressure sensor is provided with the movable electrode sections 14*m* and fixed electrode sections 14*f* each extending in a direction perpendicular to the top surface of the substrate 11. In such a configuration, it is possible to improve the sensitivity of the pressure sensor 10 by a decrease in distance between each of the fixed electrode sections 14*f* and each of the movable electrode sections 14, increase in number of the fixed electrode sections 14*f* and movable electrode sections 14, increase area of each of the opposed surfaces of the fixed electrode sections 14*f* and movable electrode sections 14*m*, and the like. That is, it is possible to improve the sensitivity without changing the structure of the membrane 16.

For example, in order to improve the sensitivity of the pressure sensor of the above-mentioned comparative example, it is necessary to increase the area of the membrane or to decrease the distance between the membrane and substrate. When the area of the membrane is increased, the area (footprint) of the top surface of the pressure sensor itself becomes larger. When the distance between the membrane and substrate is decreased, the manufacture of the pressure sensor is made difficult.

According to this embodiment, it is possible to improve the sensitivity of the pressure sensor 10 without changing the structure of the membrane 16. When the distance between each of the fixed electrode sections 14*f* and each of the movable electrode sections 14*m* is decreased, the footprint of the pressure sensor 10 also becomes smaller. Increasing the number of, and increasing the areas of the opposed surfaces of the fixed electrode sections 14*f* and movable electrode sections 14*m* do not greatly impact on the overall size of the pressure sensor 10. Accordingly, it is possible to easily achieve size reduction of the pressure sensor 10. Manufacture of the pressure sensor 10 is also facilitated.

(C) According to this embodiment, the anchor 17 connecting the membrane 16 and movable electrode sections 14*m* to each other is provided in the center of the plane of the membrane 16. The center of the plane of the membrane 16 is the part at which the membrane 16 is bent by the largest amount of displacement when external pressure is applied to the membrane 16. By arranging the anchor 17 at the part at which the amount of bending is the largest, the depression amount of the movable electrode sections 14*m* is made larger. Accordingly, the pressure sensor 10 can detect a change in external pressure more accurately.

(D) According to this embodiment, the anchor 17 is formed into a shape having rotational symmetry. Thereby, it is possible to more uniformly transmit the bending of the membrane 16 to the movable electrode sections 14*m* arranged in four directions relative to the membrane 16. Accordingly, the accuracy of the pressure sensor 10 is improved.

(E) According to this embodiment, the membrane 16 and the anchor 17 have electrical conductivity. That is, as described above, the membrane 16 and the anchor 17 may be formed of, for example, Si, SiGe or the like doped with impurities. As described above, each of the membrane 16 and the anchor 17 has an electrically conductive substance as the principal component, whereby it is possible to achieve the configuration in which the parallel-plate capacitance between the fixed electrode sections 14*f* and movable electrode sections 14*m* is detected through the membrane 16 and anchor 17. Accordingly, detection of the parallel-plate capacitance is facilitated.

(F) According to this embodiment, a plurality of comb-like protrusions corresponding to the movable electrode sections 14*m* and fixed electrode sections 14*f* are arranged in such a manner that the protrusions have symmetry in the plane of the membrane 16. Thereby, the bending of the membrane 16 is uniformly transmitted to the movable electrode sections 14*m* and fixed electrode sections 14*f*, and the accuracy of the pressure sensor 10 is improved.

(G) According to this embodiment, the movable electrode sections 14*m* protrude from the movable body 14*b*, and the membrane 16 moves the movable electrode sections 14*m* by means of the anchor 17 through the movable body 14*b*. As described above, the pressure sensor 10 includes the movable body 14*b*, whereby it becomes easier to transmit the movement of the membrane 16 from the anchor 17 to the movable electrode sections 14*m*.

(H) According to this embodiment, the movable body 14*b* includes the openings 14*a* at a part thereof. The thin layer 16*b* of the membrane 16 includes openings 16*a* at a part thereof.

Thereby, it is possible to make the vapor of hydrofluoric acid or the like flowing into the inside from the openings 16*a* of the thin layer 16*b* reach the sacrificial film 12*x* more securely at the time of manufacture of the pressure sensor 10.

Further, in the pressure sensor 10 after the manufacture thereof, it is possible to achieve weight reduction of the movable body 14*b*. Thereby, it is possible to suppress, for example, the movable body 14*b* from being moved by acceleration applied thereto. Further, it becomes easier to detect a minute pressure change.

(I) According to this embodiment, the openings 14*a* of the movable body 14*b* are arranged in such a manner that the openings 14*a* have symmetry in the plane of the membrane 16. The openings 16*a* of the thin layer 16*b* of the membrane 16 are arranged in such a manner that the openings 16*a* have symmetry in the plane of the membrane 16.

Thereby, it is possible to make the vapor of hydrofluoric acid or the like reach the sacrificial films 15*x* and 12*x* more uniformly at the time of manufacture of the pressure sensor 10, and the sacrificial films 15*x* and 12*x* are etched more uniformly.

Further, in the pressure sensor 10 after the manufacture thereof, the weight of the movable body 14*b* becomes more uniform in relation to the anchor 17 serving as the origin, and the inclination or the like of the movable body 14*b* can be suppressed from occurring.

(J) According to this embodiment, the movable electrode sections 14*m* and the fixed electrode sections 14*f* are formed of the silicon film 13*x* provided above the substrate 11. That is, the movable electrode sections 14*m* and the fixed electrode sections 14*f* are formed of, for example, an identical and uniform film. Thereby, the electrical characteristics of the movable electrode sections 14*m* and fixed electrode sections 14*f* become more uniform, and the accuracy of pressure detection is improved.

<Second Embodiment>

This embodiment will be described below by using FIGS. 14 to 16. A pressure sensor 20 of this embodiment differs from the aforementioned embodiment in that the pressure sensor 20 is provided with a reinforcing body 28*o* configured to protect the membrane 16.

(1) Configuration Example and Manufacturing Method of MEMS

Figure 14:
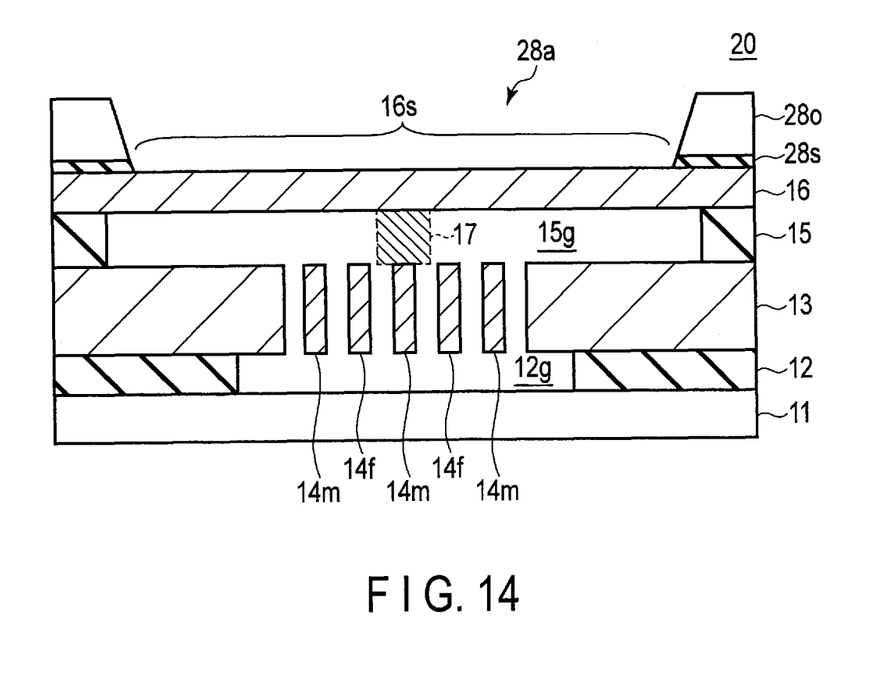
FIG. 14 shows a configuration example of a MEMS according to a second embodiment in a cross section thereof.

FIG. 14 shows a configuration example of a MEMS according to this embodiment in cross section.

As shown in FIG. 14, the pressure sensor 20 has a configuration identical to the aforementioned pressure sensor 10. The pressure sensor 20 is provided with a stopper 28*s* on the top surface of the membrane 16, and a reinforcing body 28*o* is provided on the top surface of the stopper 28*s*.

The reinforcing body 28*o* has, for example, a-Si or the like as the principal component. The stopper has, for example, SiO or the like as the principal component. Each of the reinforcing body 28*o* and the stopper 28*s* has an opening 28*a* in the plane of each of them. At least part of a movable plane 16*s* of the membrane 16 is exposed at the opening 28*a*.

Figure 15:
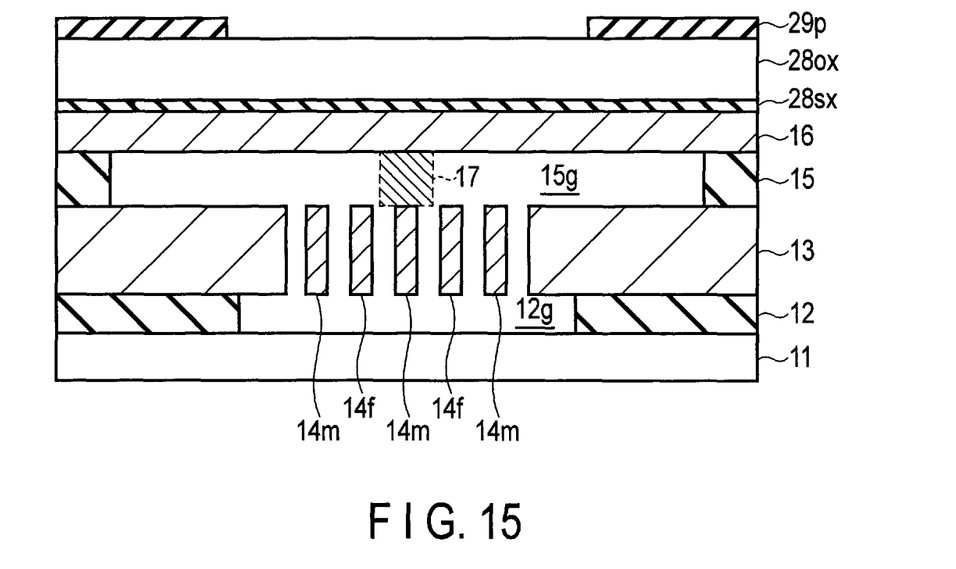
FIG. 15, and FIG. 16 each show an example of a manufacturing process of the MEMS according to the second embodiment.
Figure 16:
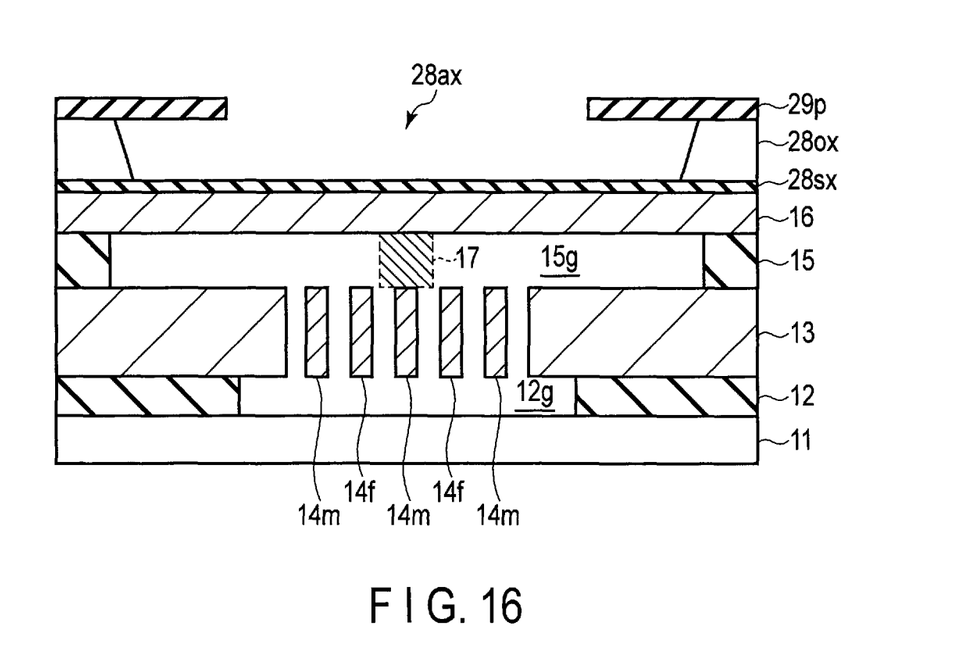

FIG. 15 and FIG. 16 each show an example of a manufacturing process of the MEMS according to this embodiment.

As shown in FIG. 15, after a process identical to the aforementioned pressure sensor 10 is carried out, a stopper layer 28*sx* is formed on the top surface of the membrane 16. A reinforcing film 28*ox* is formed on the top surface of the stopper layer 28*sx*. A resist pattern 29*p* is formed on the top surface of the reinforcing film 28*ox*.

As shown in FIG. 16, the reinforcing film 28ox is etched by using the resist pattern 29p as a mask, and an opening 28ax is formed. Etching of the reinforcing film 28ox is isotropically carried out by using a gas such as xenon fluoride (XeF) or the like, while securing a selectivity to the stopper layer 28sx. Thereby, the etching of the reinforcing film 28ox is carried out while causing side etching, and an opening 28ax larger than the dimensions of the resist pattern 29p is formed. The etching is stopped by the stopper layer 28sx. For this reason, even when the reinforcing film 28ox has, for example, a substance identical to the membrane 16 as the principal component, the membrane 16 is suppressed from being etched. When the reinforcing film 28ox has a substance different from the membrane 16 as the principal component, the stopper layer 28sx may not be formed.

After this, the stopper layer 28sx is etched by, for example, the vapor or the like of hydrofluoric acid by using the reinforcing film 28ox as a mask, whereby the pressure sensor 20 is manufactured.

According to this embodiment, in addition to the effects of the aforementioned embodiment, the following effect is produced.

According to this embodiment, the pressure sensor 20 is provided with a reinforcing body 28o including an opening 28a above the membrane 16. The membrane 16 is configured of, for example, thin layers 16b, and 16m, and the like, and has a fragile structure. By providing a reinforcing body 28o on the top surface of the membrane 16, it is possible to suppress the membrane 16 from being damaged by a certain physical body colliding with the membrane 16.

(2) Modification Examples of the Embodiment

Figure 17:
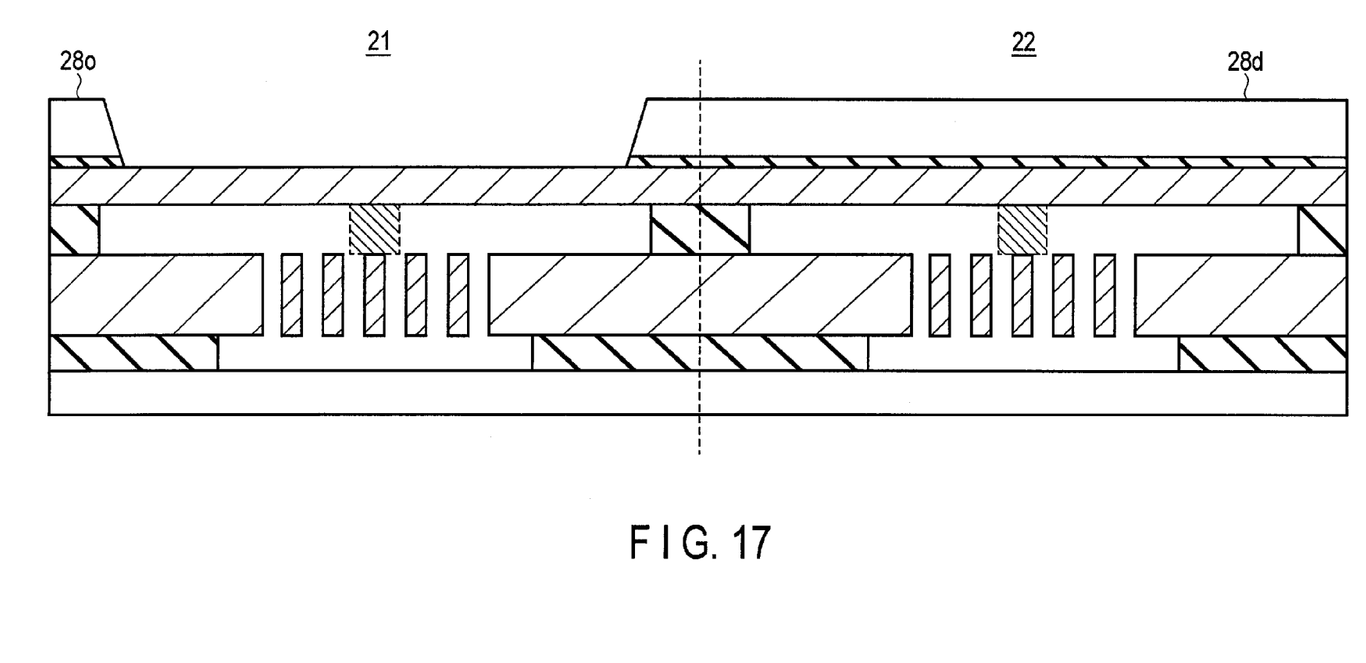
FIG. 17, FIG. 18, and FIG. 19 respectively show modification examples of the MEMS according to the second embodiment.
Figure 18:
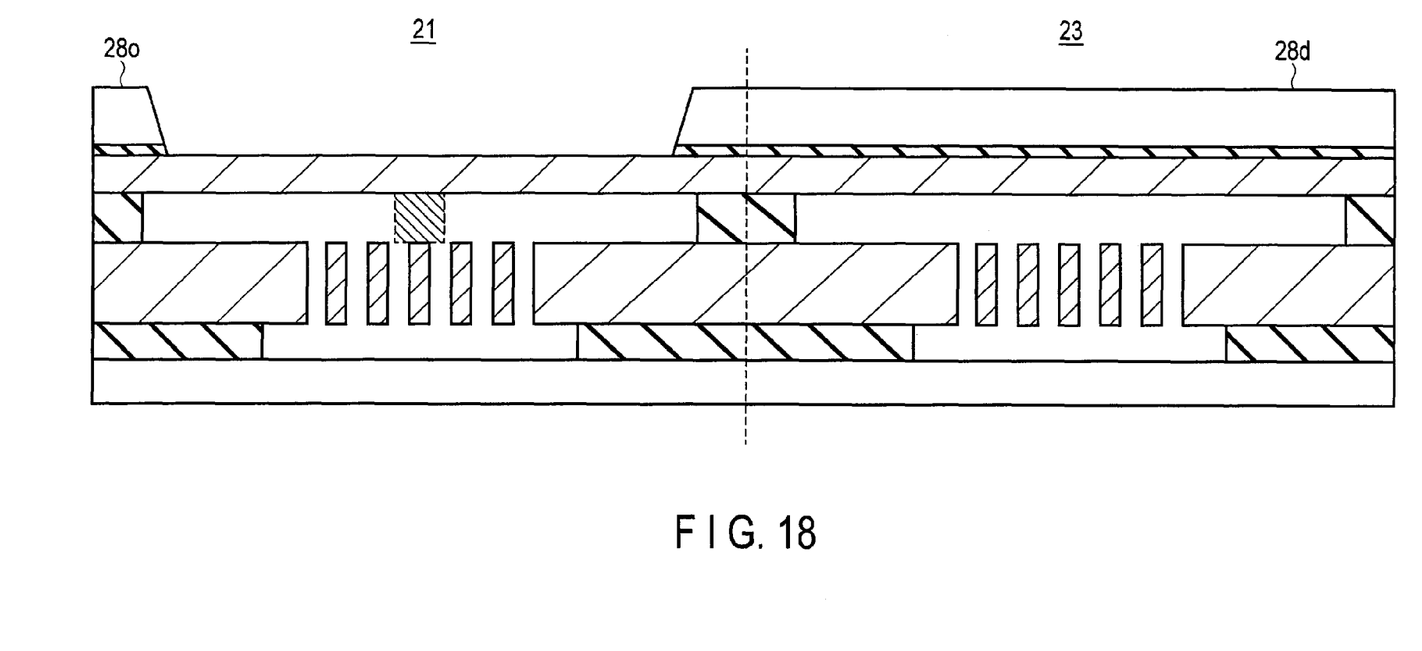
Figure 19:
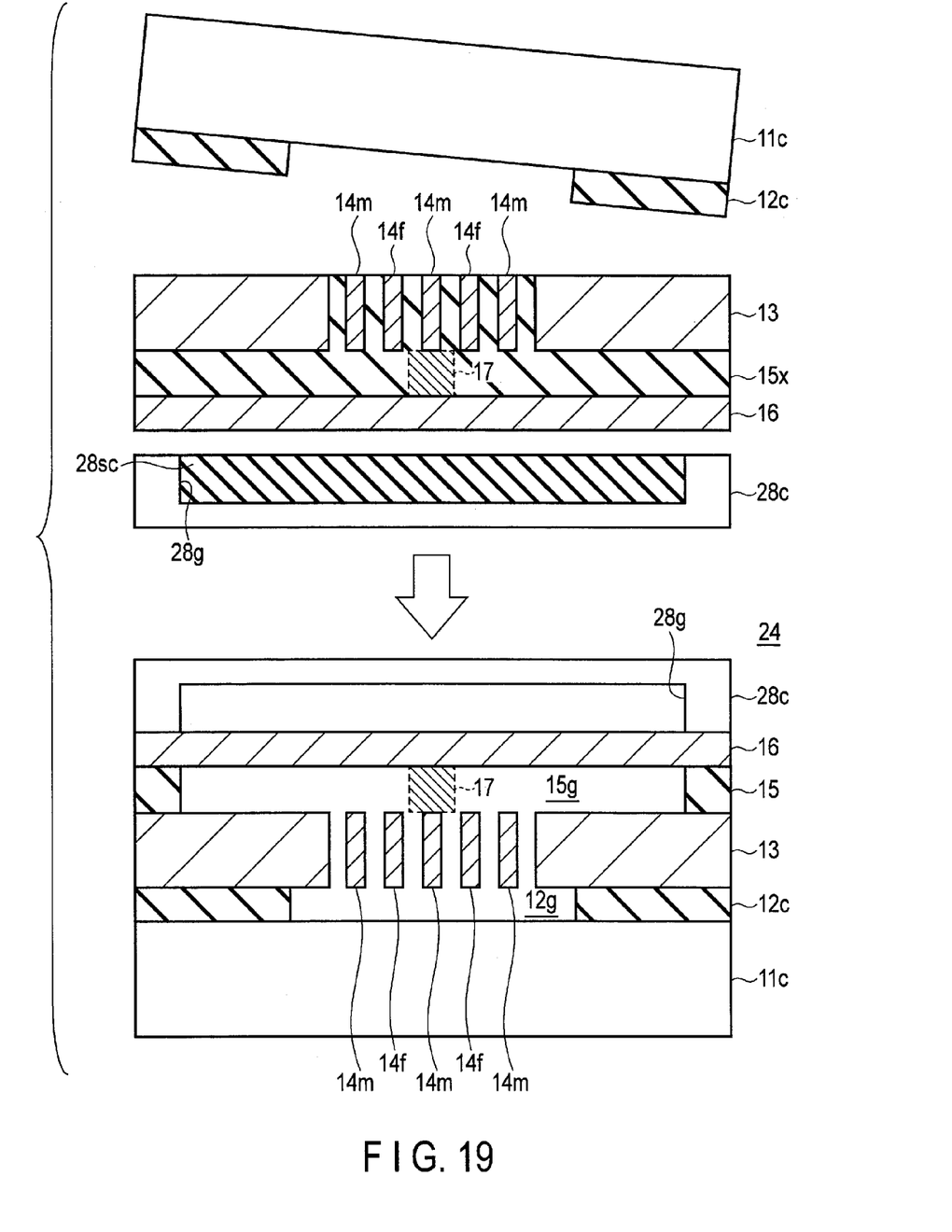

Configuration examples of MEMSs according to modification examples of this embodiment will be described below by using FIGS. 17 to 19. FIGS. 17 to 19 show modification examples of the MEMS according to this embodiment.

The modification example shown in FIG. 17 differs from the embodiment described above in that the MEMS is provided with a pressure sensor 21 as a first MEMS, and reference 22 as a second MEMS.

As shown in FIG. 17, the reference 22 is provided with a reinforcing body 28d covering a part above the membrane 16. That is, the reinforcing body 28d has no opening 28a. Thereby, the membrane 16 of the reference 22 is not subject to the influence of the external pressure, and it is possible to use the reference 22 as the reference capacitance for the pressure sensor 21. Accordingly, by comparing an output value of the pressure sensor 21 and output value of the reference 22 with each other, it becomes possible to correct an individual difference or the like of the pressure sensor 21, and carry out detection of pressure with a higher degree of accuracy.

The modification example shown in FIG. 18 differs from the embodiment described above in that the MEMS is provided with a pressure sensor 21 as a first MEMS and sensor 23 configured to detect a physical quantity different from the pressure sensor 21 as a second MEMS.

As shown in FIG. 18, the sensor 23 is provided with a reinforcing body 28d covering a part above the membrane 16. Further, the sensor 23 is provided with no anchor 17. The sensor 23 configured as described above is used as an acceleration sensor configured to detect, for example, acceleration as a physical quantity different from the pressure sensor 21 or a gyroscope configured to detect angular velocity, or the like. Thereby, a MEMS capable of detecting not only one type of physical quantity, but also a plurality of physical quantities is configured.

The modification example shown in FIG. 19 differs from the embodiment described above in that a pressure sensor 24 is provided with a cap-like reinforcing body 28c.

As shown in FIG. 19, in the manufacturing process of the pressure sensor 24, a reinforcing body 28c having a cap-like shape including a concave part 28g is formed. The reinforcing body 28c has, for example, Si or SiGe or the like as the principal component. In the concave part 28g, for example, a sacrificial film 28sc is embedded.

On the top surface of the sacrificial film 28sc, a membrane 16, sacrificial film 15x, and a second film 13 provided with fixed electrode sections 14f and movable electrode sections 14m are formed in the order mentioned. The sacrificial film 28sc is removed at, for example, a stage at which the membrane 16 is formed.

A substrate 11c is joined to the top surfaces of the fixed electrode sections 14f, movable electrode sections 14m, and second film 13 through a first film 12c. The first film 12c is formed in advance on, for example, one surface of the substrate 11c on the side to be opposed to the fixed electrode sections 14f, movable electrode sections 14m, and second film 13. The sacrificial film 15x is processed into a third film 15 at, for example, a stage at which the substrate 11c is joined to the top surfaces of the fixed electrode sections 14f, movable electrode sections 14m, and second film 13.

Thus, the pressure sensor 24 is manufactured.

<Other Embodiments>

In each of the above-mentioned embodiments, although a case where only one anchor 17 is arranged has been described, the embodiment is not limited to this. Anchors may be arranged at a plurality of positions in the movable plane of the membrane. By providing a plurality of anchors, joining between the membrane and movable electrode sections is enhanced, and the strength of the pressure sensor is increased. It is desirable that the plurality of anchors be arranged in such a manner that the anchors have symmetry in the membrane surface or in the movable plane.

In each of the above-mentioned embodiments, although a case where the fixed electrode sections 14f and the movable electrode sections 14m are arranged in four directions has been described, the embodiment is not limited to this. Regarding the number of the fixed electrode sections and the movable electrode sections, it is sufficient if at least a pair of fixed electrode sections and movable electrode sections is provided, and the number of the fixed electrode sections and the movable electrode sections may be greater or less than the example of FIG. 1. Further, the arrangement of the fixed electrode sections and the movable electrode sections is not limited to the example of FIG. 1. However, it is desirable that the fixed electrode sections and the movable electrode sections be arranged in such a manner that the fixed electrode sections and the movable electrode sections have symmetry in the membrane surface or in the movable plane.

In each of the above-mentioned embodiments, although a case where the movable body 14b includes the openings 14a has been described, the embodiment is not limited to this. Even when the movable body includes no openings, it is possible to make the vapor of hydrofluoric acid or the like reach the sacrificial film below through the gaps between the fixed electrode sections and movable electrode sections.

In the above-mentioned embodiment, although an example in which the substrate 11 having Si or SiGe or the like as the principal component is used in the manufacturing process of the pressure sensor 10 has been described, the embodiment is not limited to this. A substrate having another substance as the principal component may be used and, for example, a silicon-on-insulator (SOI) substrate may also be used. In this case, an active layer can be used as the second film, fixed electrode sections, and movable electrode sections, and a buried oxide (BOX) layer can be used as the first film.

In each of the above-mentioned embodiments, the pressure sensor may be provided with a complementary metal-oxide semiconductor (CMOS) layer including wiring and a contact, and a circuit including semiconductor devices such as CMOS transistors below the movable electrode sections and fixed electrode sections. The parallel-plate capacitance between the movable electrode sections and fixed electrode sections may be detected by such a circuit including the CMOS layer and the CMOS transistors. Detection of the parallel-plate capacitance may be carried out by a circuit including a metal-oxide semiconductor field-effect transistor (MOSFET) (not configured as a CMOS transistor), bipolar transistor, and the like as the semiconductor devices.

In each of the above-mentioned embodiments, although a case where the MEMS is a pressure sensor 10, 20 or the like has been described, the embodiment is not limited to this. The MEMS provided with the configuration of the above-mentioned embodiments can also be applied to a micro-pump, a variable capacitor used for tuning device or the like of a radio set, or the like in addition to the pressure sensor. When the MEMS is utilized as a micro-pump, a voltage is applied to the fixed electrode sections and/or the movable electrode sections, whereby the membrane is driven to play a role of a pump. At this time, the membrane and the anchor may be configured of an electrically-conductive material, and a voltage may be applied to the movable electrode sections through the membrane and anchor.

Further, as described above, a MEMS provided with the configuration of FIG. 18 can also be used as an acceleration sensor, gyroscope, and the like. In this case, the acceleration sensor, gyroscope, and the like can be used singly. That is, in the configuration of FIG. 18, the pressure sensor may be omitted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A micro electro mechanical system (MEMS) comprising:
    a first MEMS and a second MEMS, each of the first MEMS and the second MEMS comprising:
    a substrate;
    a membrane arranged above the substrate;
    a first conductor with a first plane, the first conductor being arranged between the substrate and the membrane, and the first conductor being connected to the membrane; and
    a second conductor with a second plane facing the first plane, the second conductor being arranged between the substrate and the membrane, and the second conductor being arranged with a gap between the first conductor and the second conductor,
    wherein relative positions of the first conductor and the second conductor change in a direction in which an area of the first plane facing the second plane changes,
    wherein the first MEMS is provided with a first reinforcing body including an opening at a part above the membrane; and
    wherein the second MEMS is provided with a second reinforcing body covering a part above the membrane, and
    wherein the first MEMS and the second MEMS are sensors configured to detect physical quantities different from each other.

2. The MEMS of claim 1, wherein, in each of the first MEMS and the second MEMS, the membrane and the first conductor are connected to each other through an anchor.

3. The MEMS of claim 2, wherein, in each of the first MEMS and the second MEMS, the anchor is provided in the center of the membrane plane.

4. The MEMS of claim 2, wherein, in each of the first MEMS and the second MEMS, the anchor possesses a shape with rotational symmetry.

5. The MEMS of claim 2, wherein, in each of the first MEMS and the second MEMS, the membrane and the anchor possess electrical conductivity.

6. The MEMS of claim 5, wherein, in each of the first MEMS and the second MEMS, a voltage is applied to the first conductor through the membrane and the anchor.

7. The MEMS of claim 1, wherein, in each of the first MEMS and the second MEMS, the first conductor and the second conductor are a part of a comb-shaped electrode structure.

8. The MEMS of claim 7, wherein, in each of the first MEMS and the second MEMS, the comb-shaped electrode structure is provided with a plurality of comb-like protrusions, and the plurality of comb-like protrusions are arranged in such a manner that the comb-like protrusions possess symmetry with respect to the membrane plane.

9. The MEMS of claim 2, wherein, in each of the first MEMS and the second MEMS, the first conductor protrudes from a movable body, and the membrane is arranged to move the first conductor by means of the anchor through the movable body.

10. The MEMS of claim 9, wherein, in each of the first MEMS and the second MEMS, the movable body includes openings at a part of the movable body.

11. The MEMS of claim 10, wherein, in each of the first MEMS and the second MEMS, the first conductor and the second conductor are derived from the same film provided above the substrate.

12. The MEMS of claim 1, wherein the first MEMS is a pressure sensor.

13. The MEMS of claim 3, wherein the second MEMS is a reference capacitance.

14. The MEMS of claim 3, wherein the second MEMS is an acceleration sensor or a gyroscope.

15. The MEMS of claim 3, wherein, in each of the first MEMS and the second MEMS, the membrane covers the first and second conductors.

16. The MEMS of claim 3, wherein, in each of the first MEMS and the second MEMS, the second conductor is fixed to the substrate.

* * * * *